United States Patent [19]

Yokoya

[11] Patent Number: 5,604,924
[45] Date of Patent: Feb. 18, 1997

[54] RADIO COMMUNICATION APPARATUS IN WHICH OUTPUT POWER IS CONTROLLED BY PULSE WIDTH MODULATION USING A MOBILE ATTENUATION CODE

[75] Inventor: Satoshi Yokoya, Kanagawa, Japan

[73] Assignee: Sony Corporation, Tokyo, Japan

[21] Appl. No.: 237,151

[22] Filed: May 3, 1994

[30] Foreign Application Priority Data

May 25, 1993 [JP] Japan ................................. 5-145508

[51] Int. Cl.⁶ .......................... H04B 7/005; H04Q 7/32
[52] U.S. Cl. ........................ 455/68; 455/92; 455/126; 455/127; 330/279; 330/297
[58] Field of Search .................................. 455/126, 127, 455/70, 115, 116, 67.1, 92, 38.3, 68, 69; 330/278, 279, 297

[56] References Cited

U.S. PATENT DOCUMENTS

| 4,654,882 | 3/1987 | Ikeda | 455/88 |
|---|---|---|---|
| 5,065,450 | 11/1991 | Wu et al. | 455/20 |
| 5,101,175 | 3/1992 | Vaisanen | 455/126 |
| 5,101,507 | 3/1992 | Jung | 455/127 |
| 5,126,688 | 6/1992 | Nakanishi et al. | 330/285 |
| 5,182,527 | 1/1993 | Nakanishi et al. | 455/127 X |
| 5,193,219 | 3/1993 | Tamura | 455/89 |
| 5,307,512 | 4/1994 | Mitzlaff | 455/126 |
| 5,446,920 | 8/1995 | Matsumoto et al. | 455/126 |

OTHER PUBLICATIONS

UK Patent Application GB 2 199 467 A, Jul. 6, 1988 (Katsuyama).

*Primary Examiner*—Reinhard J. Eisenzopf
*Assistant Examiner*—Philip J. Sobutka
*Attorney, Agent, or Firm*—Jay H. Maioli

[57] ABSTRACT

A radio communication apparatus capable of varying the level of its transmission output, includes a receiving circuit, a transmitting circuit, an amplifier, an extractor, a detector, a variable voltage converter and a control circuit. The receiving circuit receives a signal from a second station such as a base station, and the transmitting circuit transmits a signal to the second station. The amplifier amplifies the output signal obtained from the transmitter, and the extractor extracts data from the output signal of the receiving circuit so as to control the level of the transmission output. The detector detects the level of the transmission output obtained from the amplifier, and the variable voltage converter converts a source voltage into the operating voltage of the amplifier. The control circuit produces a control signal to control the magnitude of the operating voltage supplied from the variable voltage converter to the amplifier in response to both the detection signal from the detector and the output signal from the extractor, and supplies the produced control signal to the variable voltage converter. The transmission output obtained from the amplifier is varied by changing the operating voltage supplied from the variable voltage converter to the amplifier.

6 Claims, 6 Drawing Sheets

FIG. 4A V52
FIG. 4B V46
FIG. 4C FET(43)

FIG. 5

RADIO COMMUNICATION APPARATUS IN WHICH OUTPUT POWER IS CONTROLLED BY PULSE WIDTH MODULATION USING A MOBILE ATTENUATION CODE

BACKGROUND OF THE INVENTION

1. Field of the Invention

The present invention relates to a radio communication apparatus and, more particularly, to an apparatus where the level of its transmission output is variable.

2. Description of the Related Art

In a duplex mobile telephone system portable telephone or car telephone cellular phone system, a base station is capable of controlling or designating the transmission output level of a mobile station. The reason is based on the purpose of suppressing the transmission output of a mobile station to the minimum value required for the base station, so as to increase the number of mobile stations, which can utilize the system, by using the same channel even in a cell (service area) of an other base station.

In the TACS (Total Access Communication System), the control or designation of the transmission output of a mobile station is realized by transmission of a 3-bit code termed MAC (Mobile Attenuation Code) from the base station to the mobile station. An exemplary construction for controlling the level of a transmission output in accordance with the MAC will now be described below with reference to FIG. 1.

Figure 1:
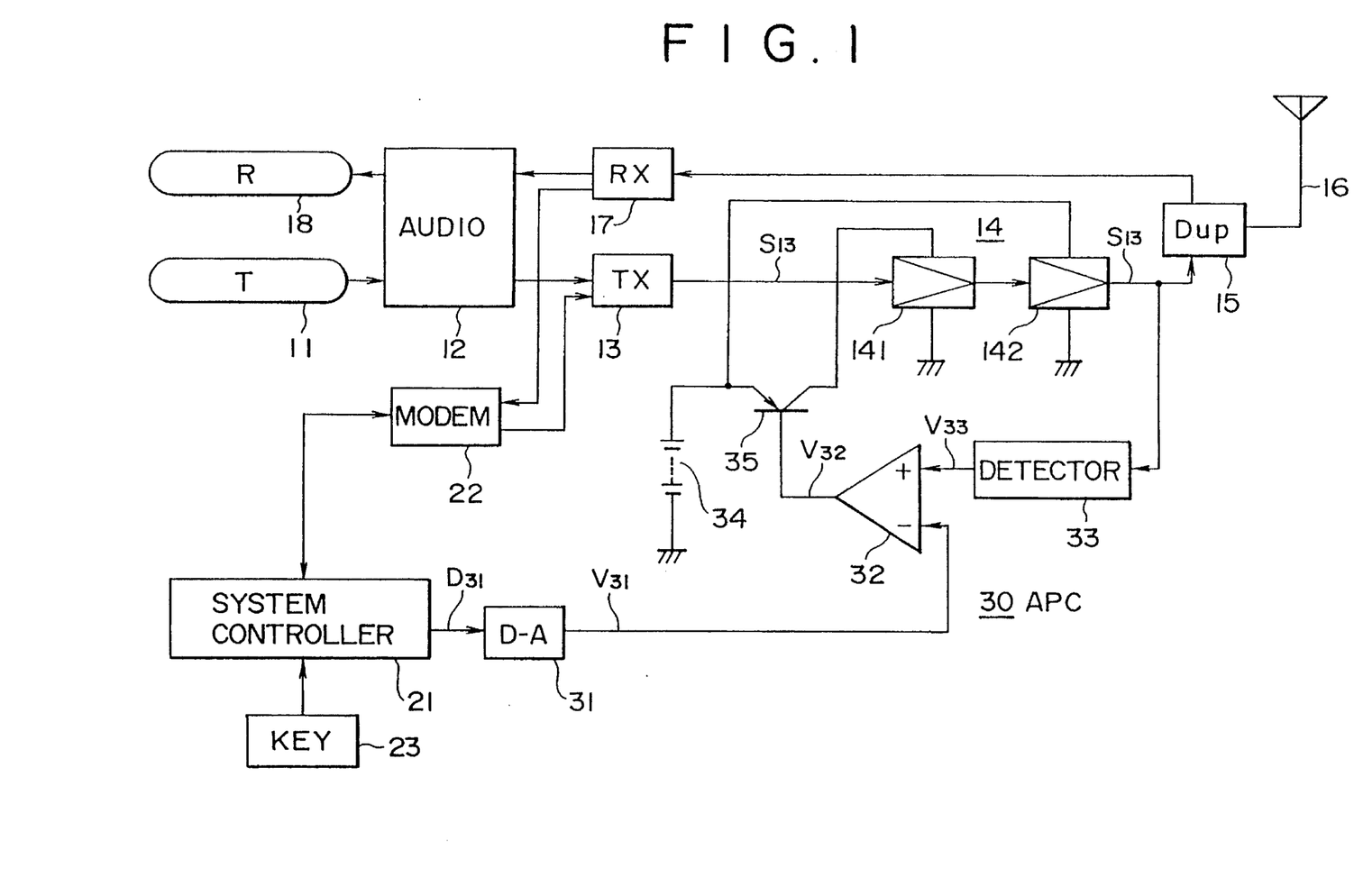
FIG. 1 is a block diagram showing an example of a radio communication apparatus which is previously known.

FIG. 1 shows a portable telephone of analog cellular system including a mouthpiece 11, an audio circuit 12, a transmitting circuit 13, a power amplifier 14, a drive stage (former stage) 141 of the amplifier, an output stage (last stage) 142 of the amplifier, a duplexer 15, a transmitting/receiving antenna 16, a receiving circuit 17, and an earpiece 18. In the amplifier 14, the drive stage 141 performs a class AB operation, while the output stage 142 performs a class C operation.

When a sound signal from the mouthpiece 11 is supplied via the audio circuit 12 to the transmitting circuit 13, it is converted into an up-channel transmission signal (FM signal) S13. This transmission signal S13 is supplied to the amplifier 14 and amplified. Then this transmission signal thus amplified S13 is supplied via the duplexer 15 to the antenna 16, from which the signal S13 is transmitted to the base station.

Meanwhile a down-channel transmission signal from the base station is received at the antenna 16. The signal thus received is supplied via the duplexer 15 to the receiving circuit 17, so that the sound signal from the talker is extracted. Thereafter the sound signal thus extracted is supplied via the audio circuit 12 to the earpiece 18.

Denoted by reference numeral 21 is a system controller which consists of a microcomputer. The system controller, transmitting circuit 13 and the receiving circuit 17 are connected to each other via a modem circuit 22, whereby a predetermined command signal or data such as a MAC can be communicated between the system controller 21 and the base station. Further the audio circuit 12, the transmitting circuit 13 and the receiving circuit 17 are controlled by the system controller 21 in response to the command signal or the data received from the base station. Denoted by 23 is an operation key such as a dial key or a talk key.

Reference numeral 30 denotes an APC (Auto Power Control) circuit for controlling the magnitude of the transmission output in accordance with the MAC. More specifically, AOC data D31 is obtained from an output port of the system controller 21 having a latch function. The AOC data D31 is changed in accordance with the MAC transmitted from the base station, so as to control the magnitude of the transmission output.

The data D31 is supplied to a D-A converter 31, where a digital-to-analog conversion is executed to convert the data D31 into an analog voltage V31. The voltage V31 thus obtained through the digital-to-analog conversion is supplied as a reference voltage to a voltage comparator 32. Further the transmission signal S13 from the power amplifier 14 is supplied to a detector 33, which then outputs a DC voltage V33 of a level corresponding to the level or magnitude of the transmission signal S13, and then the voltage V33 is supplied to the comparator 32.

The emitter-collector junction of a transistor 35 is connected in series between a battery 34 for a power supply and a power line of the drive stage 141, and a comparison output voltage V32 obtained from the comparator 32 is supplied to the base of the transistor 35 as a control signal for the transistor 35. To the output stage 142, the voltage of the battery 34 is supplied directly.

When the comparison output voltage V32 is changed in the portable telephone of the construction described above, the operating voltage supplied to the drive stage 141 is also changed in accordance with such change of the voltage V32, so that the level of the transmission signal S13 supplied from the drive stage 141 to the output stage 142 is changed in accordance with the voltage V32. Consequently, the level of the transmission signal S13 produced from the output stage 142 is changed correspondingly to the voltage V32.

Since feedback is being executed at this time by the comparator 32 in such a manner as to render V33 =V31, the level (=V33) of the transmission signal S13 produced from the output stage 142 is equalized to the level of the voltage V31.

Accordingly, it is possible to control the level of the transmission signal S13 obtained from the output stage 142 by controlling the value of the data D31 in the system controller 21, whereby the base station is able to control the magnitude of the transmission output from the portable telephone in accordance with the MAC.

In the portable telephone system, as described above, the level of the transmission output of a mobile station is suppressed to its minimum necessary value.

In a power amplifier, it is generally customary that, when the level of an input signal is high and an output is maximum, the collector voltage of an output transistor is fully swung substantially from the ground potential to the operating voltage which is equal to the supply voltage, whereby the efficiency of the amplifier is maximum. However, when the input signal level is low and the output magnitude is small, such full swing of the collector voltage is not performed, so that the efficiency of the amplifier is lowered.

Figure 2:
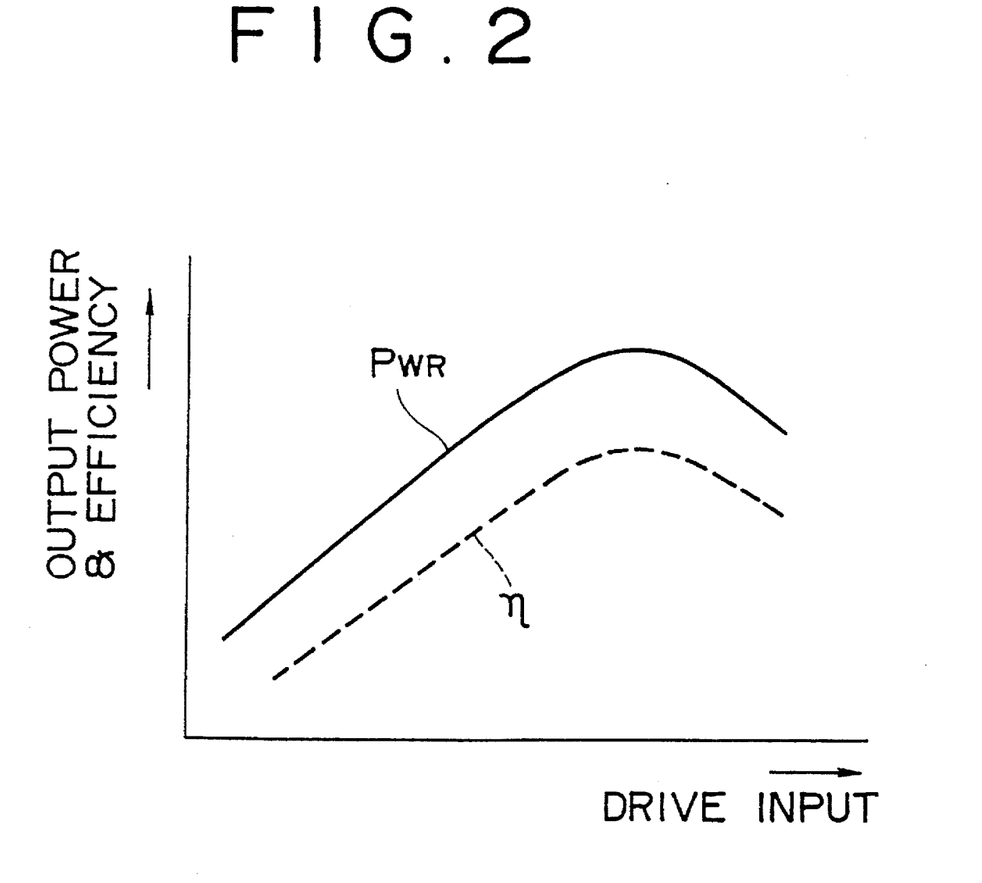
FIG. 2 graphically shows the characteristics of a power amplifier.

Therefore, as graphically shown in FIG. 2, the efficiency n of the output stage 142 in the power amplifier 14 becomes maximum when its output PWR is in the proximity of the maximum thereof. Consequently, if the transmission output is reduced by lowering the drive level of the transmission signal S13 with respect to the output stage 142 as mentioned, there arises a problem that the efficiency at the time of a small transmission output is greatly lowered in comparison with the efficiency at the time of the maximum output.

Meanwhile, when the magnitude of the transmission output is small, a great voltage drop is caused in the transistor 35 to consequently lower the operating voltage supplied to the drive stage 141, whereby the loss in the transistor 35 is increased.

Accordingly, even if the portable telephone is used in any place under satisfactory conditions where its required transmission output is small, there exists a problem that its power consumption is not reduced in comparison with the decrease of the transmission output. Such a problem brings about a disadvantage that the service life of the battery 34 is shortened to eventually shorten the effective usable time of the portable telephone.

SUMMARY OF THE INVENTION

It is therefore an object of the present invention to provide a radio communication apparatus which solves the problems mentioned above.

According to one aspect of the present invention, there is provided a radio communication apparatus capable of varying the level of a transmission output. The apparatus includes transmitting circuit, an amplifier and a variable voltage converter. The transmitting circuit forms a transmission signal, and the amplifier amplifies the transmission signal to be sent from the transmitting circuit. The variable voltage converter converts a source voltage into an operating voltage of the amplifier. The magnitude of the operating voltage supplied from the variable voltage converter to the amplifier is changeable in correspondence to the level of the transmission output.

According to another aspect of the present invention, there is provided a radio communication apparatus including a receiving circuit, a transmitting circuit, an amplifier, an extractor, a detector, a variable voltage converter and a control circuit. The receiving circuit receives a signal from a second station, and the transmitting circuit transmits a signal therefrom to the second station. The amplifier amplifies the output signal obtained from the transmitting circuit, and the extractor extracts, from the output signal of the receiving circuit, data for controlling the level of the transmission output. The detector detects the level of the transmission output obtained from the amplifier, and the variable voltage converter converts a source voltage into the operating voltage of the amplifier. And the control circuit produces, in response to both the detection signal obtained from the detector and the output signal from the extractor, a control signal for controlling the magnitude of the operating voltage supplied from the variable voltage converter to the amplifier, and then supplies the control signal thus produced to the variable voltage converter.

In the present invention where the operating voltage supplied to the amplifier is changed on the basis of the level of the transmission output, it is possible to enhance the efficiency of the amplifier regardless of the transmission output level. Due to such enhancement of the efficiency of the amplifier, even when the output voltage varies widely depending on the time of use with a battery employed as a power source, the radio communication apparatus is rendered properly usable for a long time without being harmfully effected by any variation of the source voltage.

DESCRIPTION OF THE PREFERRED EMBODIMENTS

Figure 3:
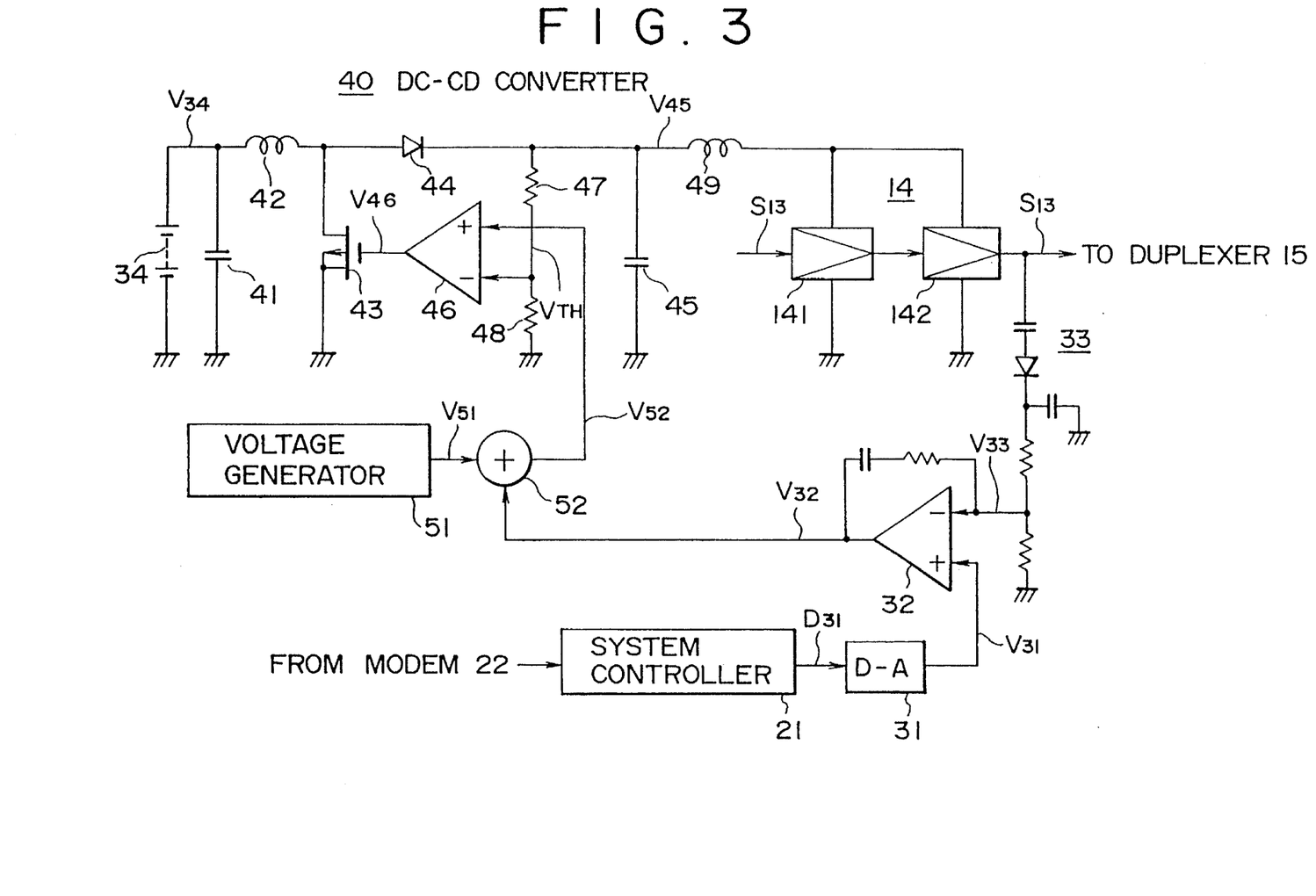
FIG. 3 is a block diagram showing a principal construction of a portable telephone in a first embodiment of the present invention.

Hereinafter the radio communication apparatus of the present invention will be described in detail with reference to the accompanying drawings. The following explanation of a preferred embodiment will be given on an exemplary case of applying the present invention to a portable telephone of an analog cellular system. FIG. 3 is a block diagram showing principal circuits of a portable telephone in the first embodiment of the invention. In this diagram, any like component elements corresponding to those in FIG. 1 are denoted by the same reference numerals or symbols, and a detailed description thereof is omitted.

In FIG. 3, reference numeral 40 denotes a variable DC—DC converter which, in this embodiment, is based on chopper type switching.

A capacitor 41 is connected in parallel to a battery 34, and a series circuit consisting of a coil 42 and the drain-source junction of an FET 43 is connected also in parallel to the battery 34. Further a series circuit consisting of a diode 44 and a capacitor 45 is connected in parallel to the drain-source junction of the FET 43. A terminal voltage V45 of the capacitor 45 is divided by resistors 47 and 48, and the divided voltage VTH is supplied as a reference voltage to a voltage comparator 46.

Meanwhile the terminal voltage V45 of the capacitor 45 is supplied via a high-frequency choke coil 49 to a power line of an amplifier 14.

Figure 4A:
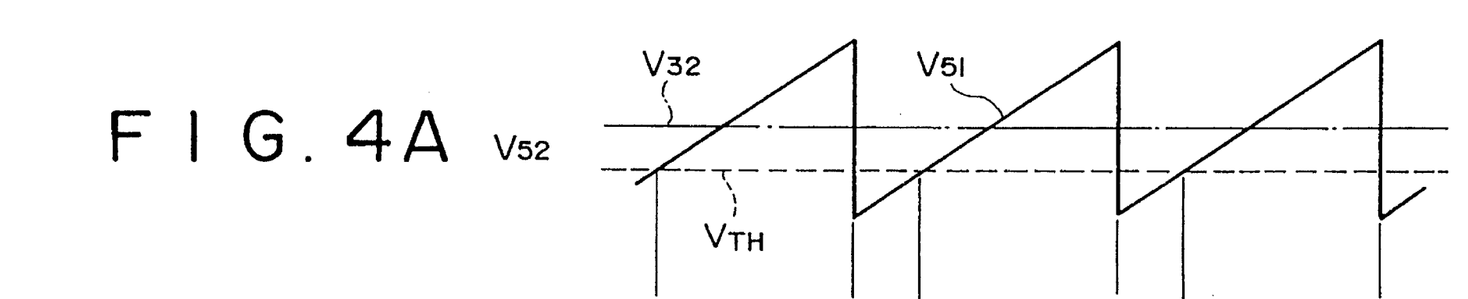
FIGS. 4A to 4C are waveform charts of signals for explaining the circuit operation in the first embodiment.
Figure 4B:
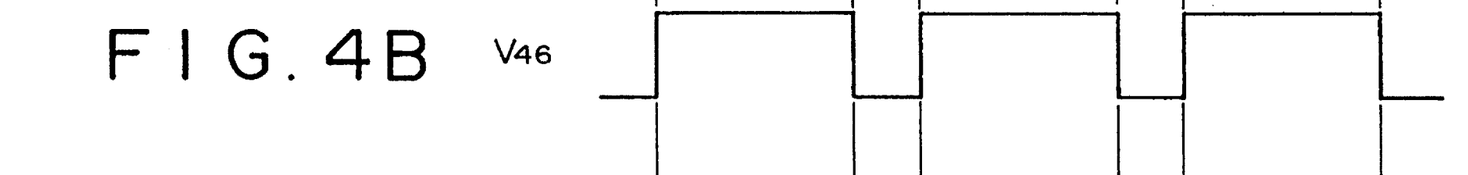

There is provided a voltage generator 51. As shown in FIG. 4A for example, the voltage generator 51 generates a sawtooth voltage V51 of a predetermined frequency. The voltage V51 thus generated is supplied to an adder 52, while the output signal of the voltage comparator 32 is supplied also to the adder 52. Then, as shown in FIG. 2A for example, the adder 52 produces an output voltage V52 which is the sum of the voltages V51 and V32 and is equal in DC level to the voltage V32.

The voltage V52 is supplied to the comparator 46, whose comparison output voltage V46 is then supplied to the gate of the FET 43.

Figure 4C:
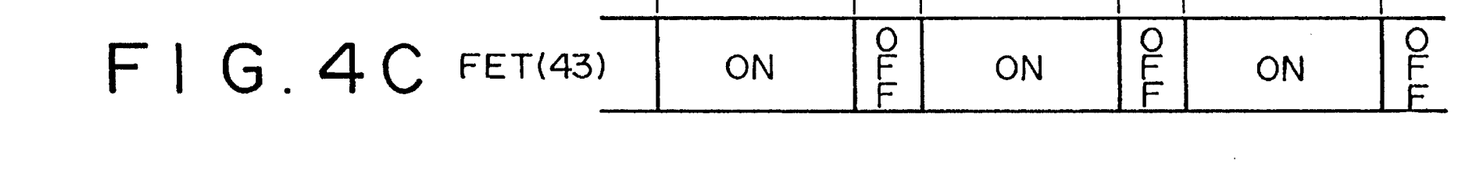

In the construction mentioned above, as shown in FIGS. 2A and 2B, the voltage V46 is turned to "H" (high level) when V52≧VTH, or is turned to "L" (low level) when V52<VTH. Consequently the voltage V46 becomes a pulse width modulated (PWM) signal whose "H" duration changes in correspondence to the level of the voltage V32, and the "H" duration thereof is proportional to the voltage V32. Since the PWM voltage V46 is supplied to the FET 43, it follows that the FET 43 is switched by the PWM voltage V46 as shown in FIG. 4C in such a manner as to be turned on when V46="H" or to be turned off when V46="L".

When the FET 43 is turned on, the voltage V34 of the battery 34 is supplied to the coil 42 by way of the line consisting of the battery 34→coil 42→FET 43→battery 34, so that the energy is stored in the coil 42. Meanwhile, when the FET 43 is turned off, the energy stored in the coil 42 is released to charge the capacitor 45 by way of the line consisting of the coil 42→diode 44→capacitor 45→capacitor 41 and battery 34→coil 42. Therefore a predetermined DC voltage V45 is obtained in the capacitor 45, and then the voltage V45 is supplied as an operating voltage to the amplifier 14 via a coil 49.

In this case, if the transmission output from the amplifier 14 is decreased for example, the voltage V33 is lowered to consequently raise the voltage V32, thereby elongating the "H" duration of the PWM voltage V46. As the "H" duration of the PWM voltage V46 is thus elongated, the on-time of the FET 43 is also elongated to consequently increase the energy stored in the coil 42, whereby the voltage V45 is raised to render the operating voltage of the amplifier 14 higher, hence increasing the transmission output.

To the contrary, if the transmission output of the amplifier 14 is increased, the voltage V33 is raised to consequently lower the voltage V32, thereby shortening the "H" duration of the PWM voltage V46. As the "H" duration of the PWM voltage V46 is thus shortened, the on-time of the FET 43 is also shortened to eventually decrease the energy stored in the coil 42, whereby the voltage V45 is lowered to render the operating voltage of the amplifier 14 lower, hence reducing the transmission output.

In this manner, the magnitude of the transmission output is so controlled, through feedback, as to maintain the state of V33=V31, so that the magnitude of the transmission output can be controlled by the data D31.

In this case, since the operating voltage V45 supplied to the amplifier 14 is controlled in accordance with the magnitude of the transmission output, the efficiency can be kept at the maximum or proximate thereto regardless of the magnitude of the transmission output. For example, in comparison with the aforementioned circuit shown in FIG. 1, the efficiency can be enhanced by 10 to 15 percent or so.

As compared with the foregoing case of the circuit in FIG. 1, the effect of enhancing the efficiency becomes greater in accordance with a reduction of the transmission output. Therefore, even under the conditions where the battery 34 is a lithium one and the output voltage V34 widely varies depending on the time of use, it is still possible to use the portable telephone for a long time properly without any harmful influence from the variation of the output voltage V34.

The operating voltage V45 is produced by directly converting the output voltage V34 of the battery 34, by means of the chopper type variable DC—DC converter 40, into a value required for the amplifier 14. Therefore the amplifier 14 is capable of continuously minimizing the loss regardless of the operating voltage V45, and thus it becomes possible to attain a high efficiency from this point of view as well.

Figure 5:
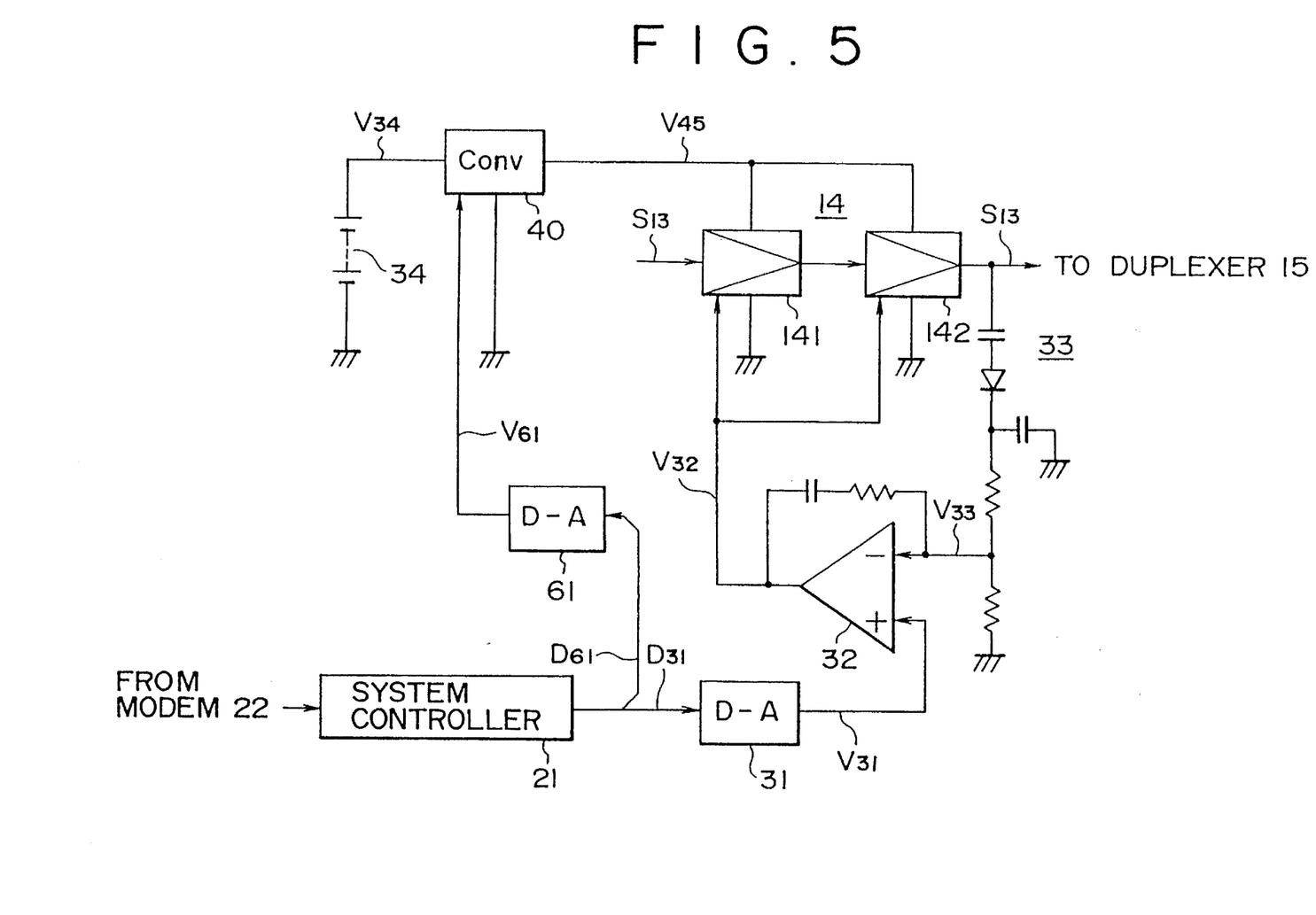
FIG. 5 is a block diagram showing a principal construction of a portable telephone in a second embodiment of the present invention.

Now the construction of a portable telephone in a second embodiment of the present invention will be described below with reference to FIG. 5. FIG. 5 is a block diagram showing principal circuits of the portable telephone according to the second embodiment. In this diagram, any like component elements corresponding to those in FIG. 3 are denoted by the same reference numerals or symbols, and a detailed description thereof is omitted.

The second embodiment shown in FIG. 5 represents an exemplary case of controlling the bias or gain of an amplifier 14 also in correspondence to the magnitude of a transmission output. In the third embodiment, data D61 of the value conforming to the MAC is extracted from an output port of a system controller 21 having a latch function. The data D61 is supplied to an D-A converter 61 where digital-to-analog conversion is executed to produce an analog voltage V61. Then the voltage V61 thus obtained is supplied to a voltage comparator 46 of a DC—DC converter 40 as a control voltage for the output voltage V45 similarly to the aforementioned voltage V52 in FIG. 3.

The output voltage V32 of the comparator 32 is supplied to the amplifier 14 as a bias or gain control voltage, whereby the bias or gain of the amplifier 14 is controlled in response to the operating voltage V45 supplied to the amplifier 14.

In the second embodiment of the construction mentioned above, the operating voltage V45 of the amplifier 14 is controlled in response to the voltage V61 which is varied in accordance with the MAC, whereby the magnitude of the transmission output is controlled in conformity to the MAC. In this third embodiment also, an enhanced efficiency is attainable in the case of a low-level transmission output as well as in the case of a high-level transmission output.

Furthermore, due to the fact that the bias or gain of the amplifier 14 is controlled in accordance with the magnitude of the transmission output, i.e., the operating voltage V45, the efficiency can be improved from this point of view as well. And since the amplifier 14 is enabled to perform in class-A or class-AB operation, no problem arises even if the signal S13 to be transmitted has an orbitrary amplitude component. Therefore it is possible to apply the above to a portable telephone of digital cellular system where the transmission signal S13 is a QPSK signal or the like.

Figure 6:
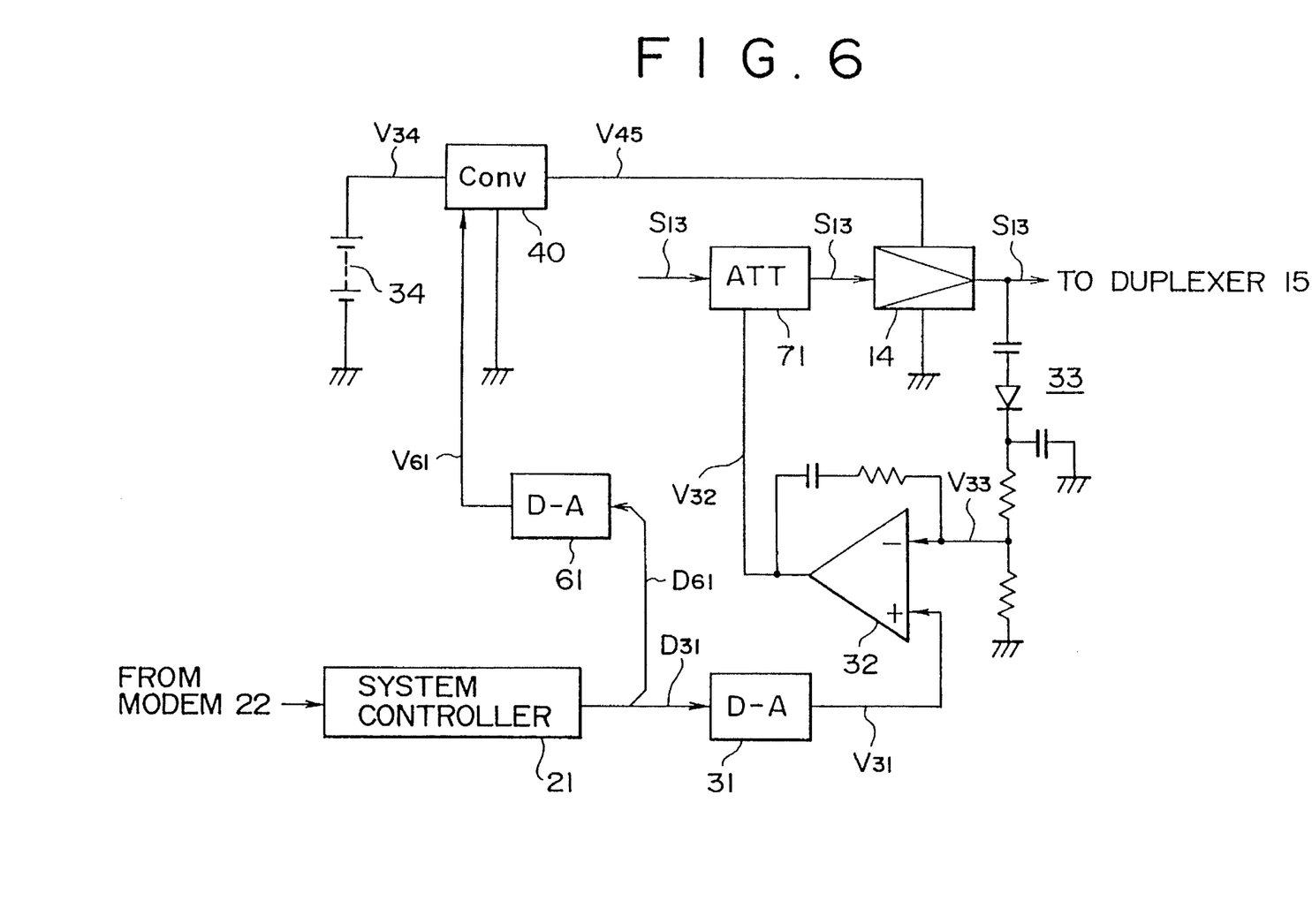
FIG. 6 is a block diagram showing a principal construction of another portable telephone in a third embodiment of the present invention.

Hereinafter the construction of another portable telephone in a third embodiment of the present invention will be described with reference to FIG. 6. FIG. 6 is a block diagram showing principal circuits in the third embodiment. In this diagram, any like component elements corresponding to those in FIG. 3 are denoted by the same reference numerals, and a detailed description thereof is omitted.

In the third embodiment of FIG. 6, a transmission signal S13 outputted from a transmitting circuit 13 is supplied via a variable attenuator 71 to a power amplifier 14, and a voltage V32 is supplied from a comparator 32 to the attenuator 71 as a control voltage thereof. And when a control action is so performed as to lower the operating voltage V45 of the amplifier 14 in response to the voltage V61, the level of the transmission signal S13 supplied from the attenuator 71 to the amplifier 14 is controlled to lower the level of the signal S13.

Consequently, in this third embodiment also, an enhanced efficiency is attainable in the case of a low-level transmission output as well as in the case of a high-level transmission output similarly to the aforementioned second embodiment of FIG. 5, and therefore it is possible to apply the third embodiment to a portable telephone of digital cellular system where the transmission signal S13 is-a QPSK signal or the like.

It is to be noted that, in the embodiment mentioned above, the output voltage V32 of the comparator 32 can be supplied as an operating voltage of the drive stage 141. And in addition to the above embodiment representing a portable telephone, similar effects can be achieved also in a transceiver or the like by applying the present invention thereto in a state where the magnitude of its transmission output is variable.

What is claimed is:

1. A radio communication apparatus capable of varying the magnitude of its transmission output comprising:

a transmitting circuit for forming a transmission signal;

a receiving circuit for receiving from a base station a signal including a mobile attenuation code;

an amplifier for amplifying the transmission signal obtained from said transmitting circuit;

a variable voltage converter for converting a source voltage into an operating voltage of said amplifier; and means for controlling said variable voltage converter, so that a magnitude of the operating voltage supplied from said variable voltage converter to said amplifier is varied in conformity to a magnitude of the transmission signal, wherein said means for controlling comprises:

a detector for detecting the magnitude of the transmission signal;

a comparator for comparing a detection signal from said detector with a value corresponding to the mobile attenuation code from said receiving circuit, wherein an output of said comparator is supplied to said variable voltage converter as a control signal for a pulse width modulator included in said variable voltage converter and a pulse width modulated signal output from said pulse width modulator is integrated to form said operating voltage of said amplifier;

a sawtooth waveform reference signal generator for generating a sawtooth waveform reference signal; and an adder for adding an output signal of said comparator to the reference signal obtained from said reference signal generator, wherein an output signal of said adder is supplied to control said pulse width modulator included in said variable voltage converter.

2. The radio communication apparatus according to claim 1, wherein a gain of said amplifier is controlled in response to a change in magnitude of the transmission signal.

3. A radio communication apparatus comprising:

a receiving circuit for receiving a signal from a base station, wherein the signal includes a mobile attenuation code;

a transmitting circuit for transmitting a transmission output signal to said base station;

an amplifier for amplifying the transmission output signal of said transmitting circuit;

an extractor for extracting said mobile attenuation code from an output signal of said receiving circuit so as to control a level of the transmission output signal;

a detector for detecting a level of an output signal obtained from said amplifier;

a variable voltage converter for converting a source voltage into an operating voltage of said amplifier, wherein the operating voltage is varied in response to a control signal fed to said variable voltage converter; and a control circuit including a comparator for comparing an output signal from said extractor and a detection signal from said detector for producing said control signal supplied to a pulse width modulator included in said variable voltage converter to control a magnitude of the operating voltage supplied to said amplifier, wherein said control circuit further includes a sawtooth waveform reference signal generator for generating a sawtooth waveform reference signal, and an adder for adding an output signal of said comparator to the reference signal obtained form said reference signal generator, wherein an output signal of said adder is supplied to control said pulse width modulator included in said variable voltage converter.

4. The radio communication apparatus according to claim 3, wherein said control circuit supplies an output signal of said comparator to said amplifier so as to control a gain of said amplifier.

5. The radio communication apparatus according to claim 3, wherein said amplifier further includes an attenuator in a first stage thereof, and said control circuit supplies the output signal of said comparator to said attenuator so as to lower the level of the transmission output signal from said transmitting circuit.

6. The radio communication apparatus according to claim 3, wherein said amplifier consists of a first amplifier and a second amplifier connected to a last stage of said first amplifier; and said first and second amplifiers are supplied with the operating voltage obtained from said variable voltage converter.

* * * * *